United States Patent [19]

August

[11] Patent Number: 5,829,512
[45] Date of Patent: Nov. 3, 1998

[54] HEATSINK AND METHOD OF FORMING A HEATSINK

[75] Inventor: Mark August, Los Gatos, Calif.

[73] Assignee: Silicon Graphics, Inc., Mountain View, Calif.

[21] Appl. No.: 520,408

[22] Filed: Aug. 29, 1995

[51] Int. Cl.$^6$ .............................. H01L 23/36; H05K 7/20
[52] U.S. Cl. .......................... 165/46; 165/185; 165/80.3; 361/704; 361/719
[58] Field of Search ........................... 165/46, 80.3, 185; 361/697, 704, 710, 703, 716, 719, 720; 257/722; 174/16.3

[56] References Cited

U.S. PATENT DOCUMENTS

| | | | |
|---|---|---|---|
| 3,160,132 | 12/1964 | Mowatt | 165/185 X |
| 4,926,935 | 5/1990 | Haushalter | 165/185 |
| 4,964,458 | 10/1990 | Flint et al. | 165/80.4 |
| 4,971,144 | 11/1990 | Gibson et al. | 165/170 |
| 4,999,741 | 3/1991 | Tyler | 165/185 X |
| 5,168,348 | 12/1992 | Chu et al. | 257/713 |
| 5,225,964 | 7/1993 | Nemes | 165/185 X |

Primary Examiner—Allen J. Flanigan
Attorney, Agent, or Firm—Blakely, Sokoloff, Taylor & Zafman

[57] ABSTRACT

A heatsink for dissipating heat from electronic components, such as integrated circuits, on a circuit board. The heatsink is formed from metal foil and comprises a series of coplanar base portions interposed with transverse fins. The heatsink can be constructed from a length of metal foil which is folded to form the base portions and transverse fins. A base layer comprising, for example, an additional strip of sheet metal material, has adhesive on both sides and is affixed to the base portions of the folded foil on one side and the surface of the electronic component using the adhesive on the other side. The foil or sheet material forming the base portions, fins and base layer of the heatsink are relatively thin and flexible such that lengths of the heatsink can be manufactured and coiled into rolls for transportation and storage. A portion of the heatsink can then be cut to length from the roll thereof and applied to a row of a plurality of components. Since the heatsink is flexible, a single strip of the heatsink can be applied to the surfaces of adjacent components even if the surfaces of those components are not coplanar.

21 Claims, 3 Drawing Sheets

5,829,512

HEATSINK AND METHOD OF FORMING A HEATSINK

FIELD OF THE INVENTION

This invention relates to a heat sink for cooling electronic components on a circuit board. In particular, the invention relates to a heatsink formed by folding a metal foil.

BACKGROUND OF THE INVENTION

Although modern integrated circuits are increasingly being designed with lower power requirements, such electronic components nevertheless frequently require aid in dissipating heat. In order to aid in cooling electronic components, such as those provided in close proximity on a printed circuit board, heatsinks are attached to a surface of the component. The heatsink generally has a larger surface area than the component to which it is attached, to facilitate heat dissipation into the air. For example, a heatsink frequently is constructed with spaced fins transverse to the surface attached to the electronic component in order to provide extra surface area.

Prior art heatsinks are commonly constructed by stamping, extruding or casting aluminum, so as to form a heatsink for cooling a single electronic component, such as an integrated circuit package. A conventional heatsink of this type is relatively bulky and stiff, and is attached adjacent a surface of the electronic component to be cooled by way of, for example, screws secured to the circuit board. In a system having many devices requiring heatsinks, the total weight of the heatsinks can make adequate stiffening of the circuit board difficult. The bulky nature of these conventional heatsinks can also have an adverse effect on air flow across the circuit board surface. Because the conventional heatsink is rigid, it cannot conform to an irregular component shape or be utilized to cool multiple components having different surface heights without presenting tolerance difficulties.

Accordingly, it is an object of the present invention to provide a heatsink which will at least substantially ameliorate the disadvantages of conventional heatsinks mentioned above. The invention also aims to present a method of forming a heatsink.

SUMMARY OF THE INVENTION

In accordance with the present invention, there is provided a heatsink comprising a metal foil having a series of base portions interposed with transverse fins. The transverse fins can be formed by folding the metal foil such that the fins and base portions are integrally formed. The folded metal foil forming the heatsink is preferably an elongate strip of copper sheet material having a thickness in the range, for example, of about 0.025 mm to 0.25 mm. It is preferred that the base surfaces of the heatsink folded foil be attached to a base sheet, which may also comprise an elongate strip of metal sheet material, such as aluminum. In one form of the invention, the base sheet is provided with an adhesive on each side, the adhesive on one side being utilized to attach the base sheet to the base portions of the folded foil, and on the other side to attach the heatsink to the surface of a component to be cooled. The adhesive surface to be utilized for attaching the heatsink to a component surface may be provided with a removable protective sheet at the time of manufacture of the heatsink so as to protect the adhesive surface prior to application of the heatsink to the component surface. A removable packing material can also be provided at manufacture, extending between adjacent folded fins to prevent undesirable bending of the fins prior to attaching the heatsink. The packing material may be in the form, for example, a strip of foamed plastics material having slits for receiving the fins of the heatsink.

The heatsink of the present invention can be manufactured in a continuous manufacturing process, wherein the folded fins separated by transverse base portions are continuously formed from a flat strip of metal foil, followed by application of the base sheet thereto with adhesive. Long strips of the heatsink, provided with the packing material, can be provided in rolls, wherein a suitable length of the heatsink material is cut from the roll of heatsink material immediately prior to application to a component surface. A single length of the heatsink, due to the flexible nature of the metal foils from which it is constructed, can be applied to the surfaces of a plurality of electronic components in a row on the surface of a circuit board, even if the component heights above the circuit board surface are not identical.

Other features and advantages of the present invention will be apparent from the appended claims, and from the detailed description of the invention that follows below.

BRIEF DESCRIPTION OF THE DRAWINGS

The invention is described in greater detail hereinafter, by way of example only, with reference to the accompanying drawings in which.

DETAILED DESCRIPTION OF PREFERRED EMBODIMENTS OF THE INVENTION

Figure 1:
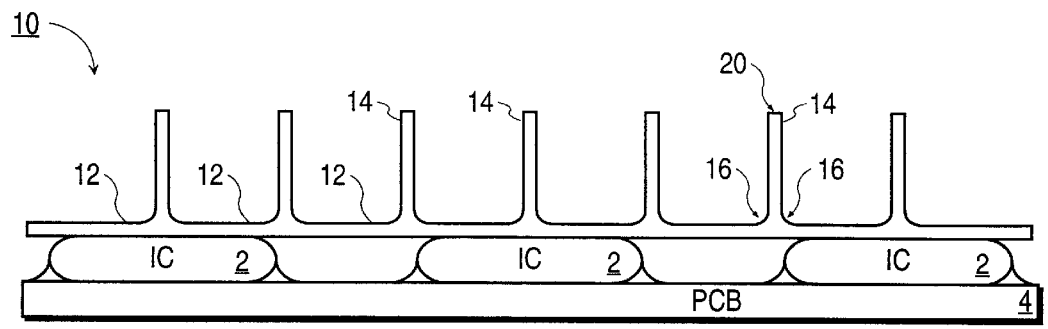
FIG. 1 is a side view of a heatsink in accordance with the present invention attached to electronic components on a circuit board.

Referring firstly to FIG. 1, there is shown a heatsink 10 according to the present invention attached to integrated circuits (ICs) 2 mounted on a printed circuit board (PCB) 4. The integrated circuits 2 may be, for example, memory circuits such as DRAM, which are typically low power consumption devices. The integrated circuits 2 illustrated are surface mount devices, and may rise only about 1 mm above the circuit board surface. Therefore, depending upon the placement of the integrated circuits 2 on the printed circuit board, and air flow over the printed circuit board surface, the integrated circuits 2 may be well within the thermal boundary layer of the printed circuit board 4, causing them to operate above their allowed temperature. A heatsink 10 in accordance with the present invention is therefore provided, attached to the upper surfaces of the integrated circuits 2.

Figure 3:
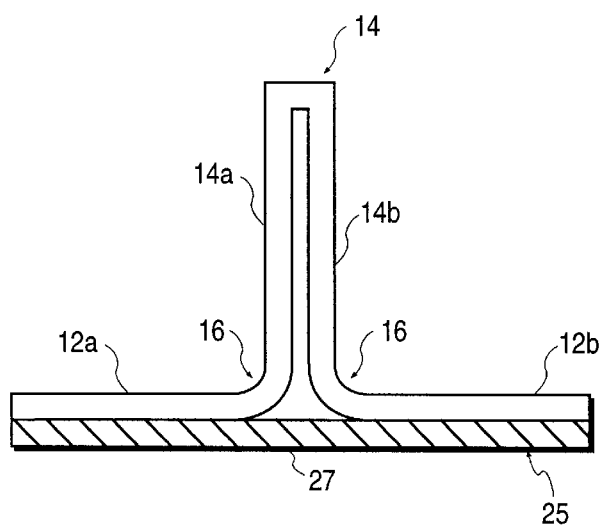
FIG. 3 is a cut-away side cross-sectional close-up view of a portion of a heatsink in accordance with an embodiment of the invention.
Figure 4:
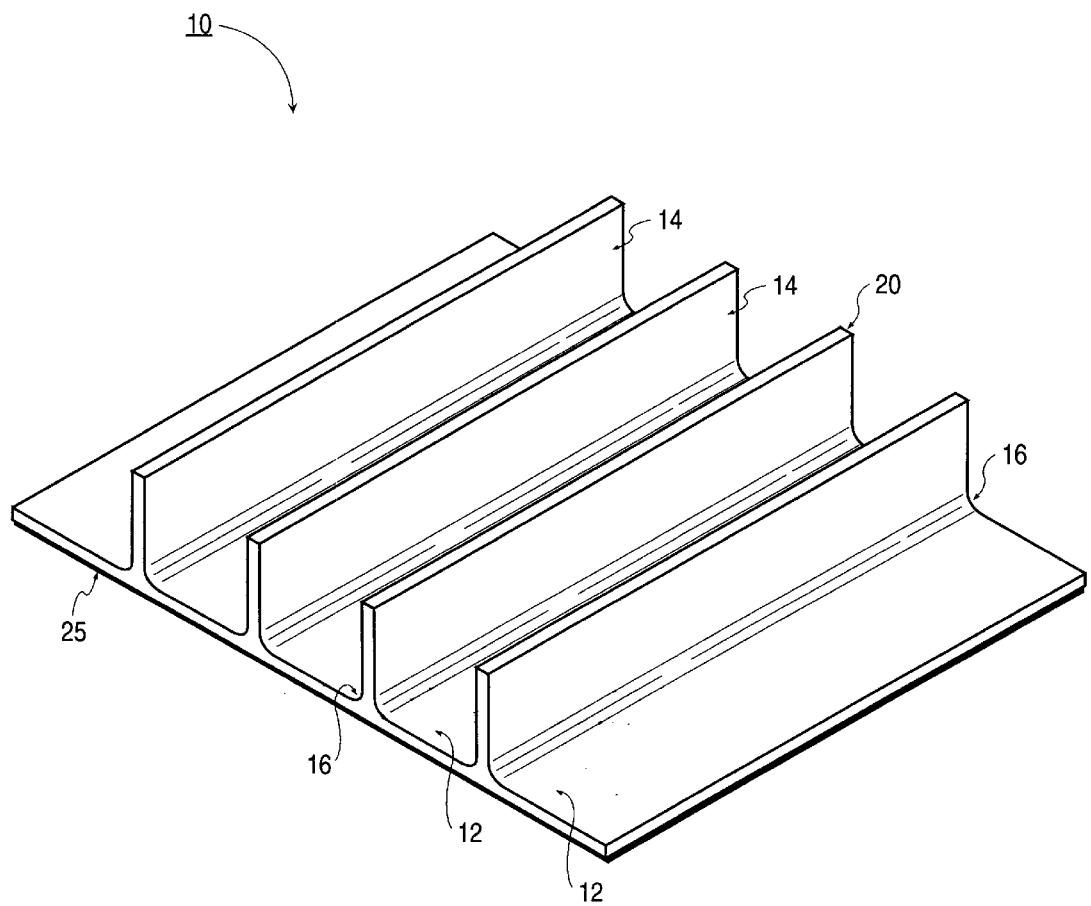
FIG. 4 is an isometric view of a heatsink in accordance with an embodiment of the present invention.

As shown best in FIGS. 1, 3 and 4, the heatsink 10 comprises a series of rectangular coplanar base portions 12 interposed between upstanding transfer fins 14. The base portions 12 and fins 14 are integrally formed from a strip of metal foil, such as copper sheet material less than about 1 mm thick. The fins 14 comprise folded portions of the metal foil, having two adjacent portions joined at a fold 20 at the edge of the fins 14. As seen best in FIG. 3, the two adjacent fin portions 14A, 14B are attached to respective base portions 12A, 12B at right angle creases 16. The inner surfaces of the fin portions 14A, 14B are closely proximate, and may be in contact with one another, such that each fin 14 is substantially flat with the metal foil being bent through 180° at the edge 20.

To aid in retaining the shape of the heatsink 10 with fins 14 integrally bent from metal foil, a further metal foil 25 is provided as a base sheet attached to the base portions 12, so that the base sheet 25 covers the base portions 12 on the side of the heatsink 10 opposed to the direction of extent of the transverse fins 14. In the preferred embodiment, the base sheet 25 comprises an aluminum foil of the same order of thickness as the foil forming base portions 12 and fins 14, and is attached to the base portions 12 by way of an adhesive. Preferably, the base sheet is provided with adhesive on both sides thereof, one side being attached during manufacture to the base portions 12, and the other side covered with a protective sheet 27 (FIG. 3). The protective sheet 27 is removed so as to expose the adhesive prior to application of the heatsink 10 to electronic components to be cooled, and the exposed adhesive is then pressed onto the surface of the components (such as integrated circuits 2) to be affixed thereto.

Figure 2:
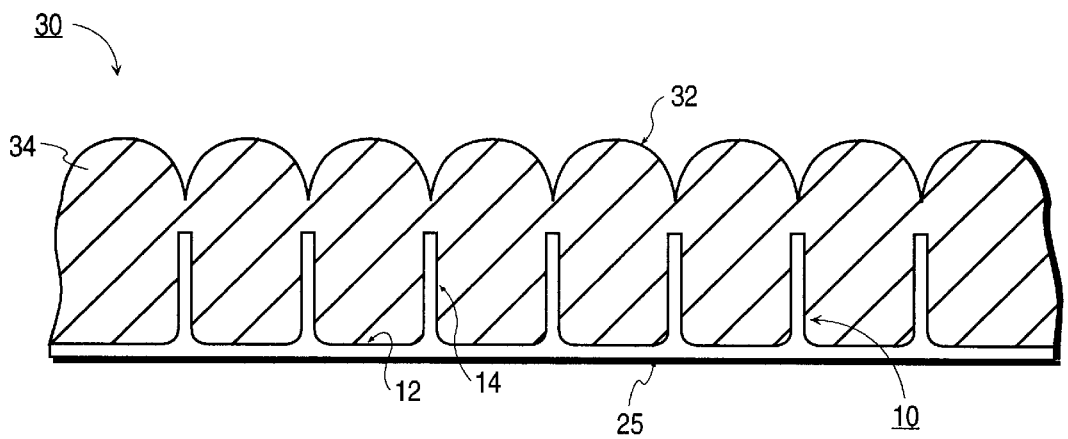
FIG. 2 is a side cross-sectional view of the heatsink before installation.

In one form of the invention, during manufacture of the heatsink 10, a removable packing material 30, such as a foamed plastics material, is applied over the fins 14 of the heatsink for protecting the fins prior to use of the heatsink. FIG. 2 is a cross-sectional illustration of a length of heatsink 10 with the removal packing material 30 which has slits into which the fins 14 project. The slits for accommodating the fins 14 define portions 34 extending between adjacent fins 14 of the heatsink to prevent unintentional bending of the fins before removal of the packing material. Surface formations 32 may also be provided on the removable packing material 30, aligned with the fins 14, to better enable downward pressure to be applied to the heatsink 10 upon affixing the heatsink to integrated circuits 2 using the adhesive on the base sheet.

Figure 5:
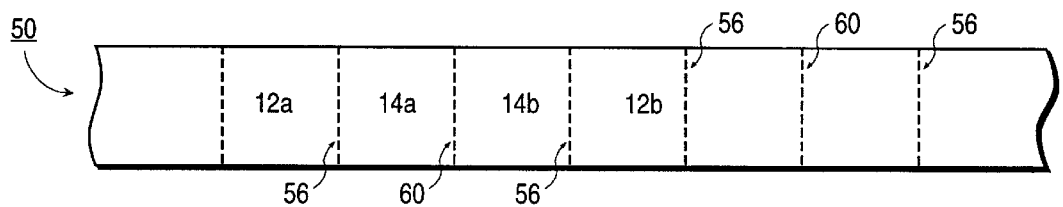
FIG. 5 is a top view of a strip of sheet material for constructing a heatsink according to one embodiment of the invention.
Figure 6:
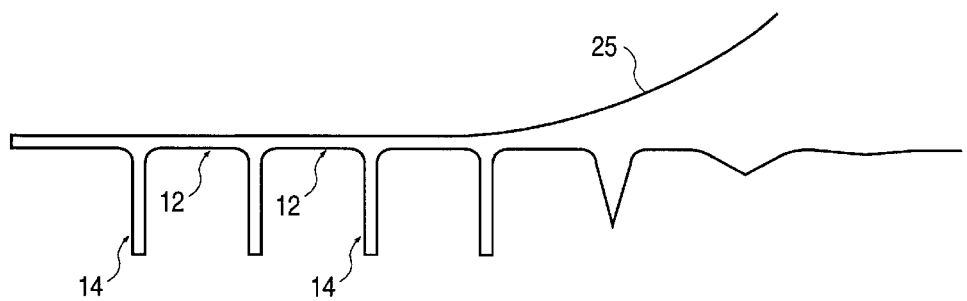
FIG. 6 is a side view illustrating formation of a heatsink according to one embodiment of the invention.

Since the heatsink 10 is integrally folded from relatively thin sheet material, with a relatively thin base sheet, it is possible to manufacture the heatsink 10 by a continuous manufacturing process wherein the fins and base portions are sequentially folded from a long length of metal foil and then applied with the base sheet. FIG. 5 illustrates a flat length of metal foil 50, showing portions 12A, 12B and 14A, 14B which will become the base portions and fin portions, respectively, in the folded heatsink. The dashed lines 56 in FIG. 5 correspond to the creases 16 at the base of the fins 14 in the formed heatsink 10, while the dashed lines 60 correspond to the folds 20 at the edges of the fins 14. FIG. 6 illustrates a continuous manufacturing process of the heatsink 10 in accordance with the present invention, wherein a flat strip of metal foil at the right-hand side of the Figure is formed into the heatsink at the left-hand side thereof. As shown in FIG. 6, the strip of foil 50 is sequentially folded so as to form the transverse fins 14 with interposed base portions 12, and then the base sheet 25, having adhesive already applied, is attached to the base portions. Any suitable sheet metal bending apparatus can be employed to carry out the folding formation of the fins and base portions, as will be recognized by those skilled in the art.

Figure 7:
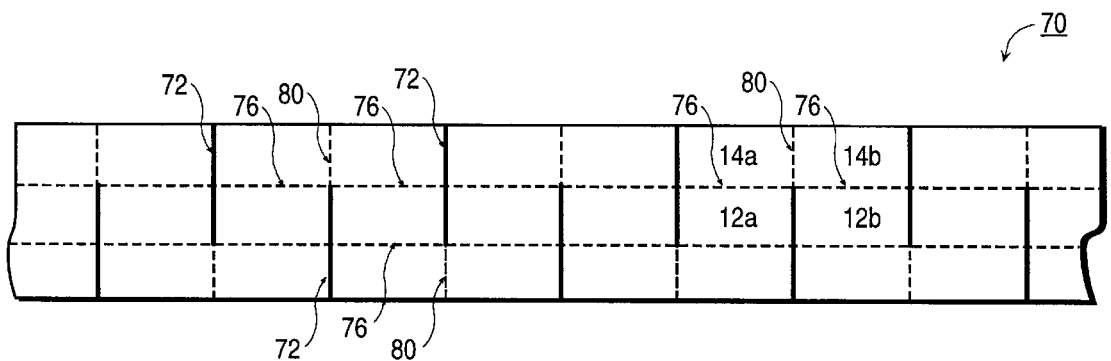
FIG. 7 is a top view of a sheet material for constructing a heatsink according to another embodiment of the invention.
Figure 8:
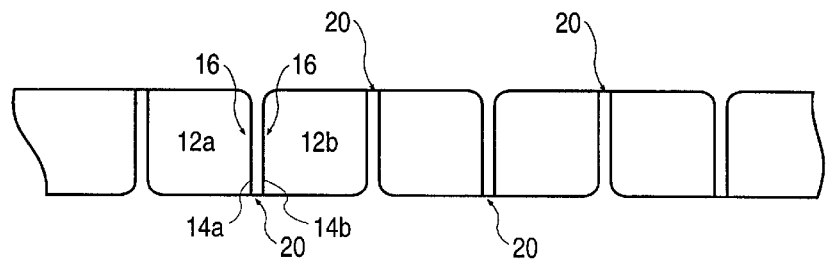
FIG. 8 is a top view of a heatsink constructed from a sheet material of FIG. 7.

FIGS. 7 and 8 illustrate an alternate form of the heatsink in accordance with the invention. The alternate form of the heatsink 10 shown in FIG. 8 has the creases 20 attaching fin portions 14A, 14B of a fin 14 on side thereof adjacent the creases 16 connecting to the base portions 12, rather than on the edge of the fin 14 opposed to the creases 16, as in the case of the heatsink 10 previously described. In order to construct the alternate form of the heatsink, a strip of foil 70 shown in FIG. 7 is utilized. The foil 70 has slits 72 cut from alternate edges of the strip at spaced intervals, defining the base portions 12A, 12B and fin portions 14A, 14B. The dashed lines 80 shown in FIG. 7 correspond to the creases 20 in the finished heatsink of FIG. 8, while the dashed lines 76 correspond to the creases 16.

Since the heatsink of the present invention can be formed in long lengths, these long lengths of heatsink can be conveniently rolled into coils at the time of manufacture thereof, for transportation and storage. The removable packing material 30 is useful at this stage to protect the fins 14. Then, in use of the heatsink, a required length of the formed heatsink 10 can be cut from the coil thereof, and applied to the circuit board components to be cooled. Application of the heatsink requires that the protective sheet be removed from the base sheet so as to expose the adhesive thereon, the heatsink 10 is pressed onto the surface of the integrated circuits 2 using the removable packing material 30, and then the packing material is removed so as to allow air flow over and between the fins 14.

Since a length of the heatsink 10 according to the preferred embodiment of the present invention can be cut to suit a particular application, a length of the heatsink 10 can be applied to a row of a plurality of electronic components on a circuit board using the adhesive of the base sheet (FIG. 1). Furthermore, since the heatsink 10 is relatively flexible, variations in the height of the surface of the components to be cooled above the surface of the circuit board can be accounted for by bending of the base portions 12 on application of the heatsink to the components.

It is preferred that the folded portion of the heatsink 10 be constructed from a copper foil because of the favorable thermal conduction characteristics of copper, although other suitable materials, such as aluminum, can also be used. In the preferred embodiment, the base sheet is formed from an aluminum foil, although another metal sheet material could also be used for this portion. Indeed, the base sheet material can be constructed from paper or plastic, since the base sheet need only conduct heat to the folded metal foil from the electronic components. In the preferred embodiment, the adhesive utilized for attaching the base sheet to the folded metal foil, and for attaching the base sheet to the electronic components, is a pressure sensitive adhesive 8043 from Adhesives Research. It should be borne in mind, however, that any suitable adhesive can be used for this purpose. The base sheet may in fact comprise an aluminum foil which is manufactured with adhesive on both sides thereof, such as a product 8044 from Adhesives Research, although other suitable base sheet materials with adhesive provided are also available from other companies such as 3M.

In one form of the invention, the folded metal foil has a thickness of about 0.076 mm (about 3 thousandths of an inch). The heatsink of the present invention can be constructed from a metal foil at least in the range of about 0.025 mm (1 thousandth of an inch) to 0.25 mm (10 thousandths of an inch), although this range is not to be considered limiting to the invention. The useful thickness of the foil used for forming the heatsink of the invention will, to some extent, depend upon the material utilized, since some metals can be more easily folded than others.

In one form of the invention, the height of the fins 14 (i.e. the transverse extent of the fins from the plane of the base portions 12) is about 1 cm (about 0.4 inches). The fin height can of course be altered to suit the application of the heatsink, such as the amount of power to be dissipated, and the available space where the heatsink will be applied. The spacing between adjacent fins of the heatsink 10 will also depend upon the cooling effect required of the heatsink, and it is envisaged that for cooling of typical low power integrated circuits a spacing of about 6 mm between adjacent fins 14 is sufficient. The fin spacing (i.e. the length of the base portions 12) may also be varied according to air flow over the circuit board on which the heatsink and integrated circuits are mounted. For example, with a fin height of about 1 cm, for low power applications and low air flow of between 0 and 250 linear feet per minute (Ifm) a fin spacing of about ¼ inch (about 6 mm) should provide sufficient cooling. For an air flow of about 100 Ifm to 500 Ifm a fin spacing of about ⅛ inch (about 3 mm) can be used, whilst for air flow of greater than about 350 Ifm a fin spacing of about 1/16 inch (1.5 mm) is preferred.

As described hereinabove, the heatsink of the preferred embodiment of the present invention is flexible and lightweight as compared to heatsinks of the prior art, allowing the present heatsink to conform to the shape of the device or devices (for example integrated circuits) to be cooled. This is particularly advantageous in applications on circuit boards containing several hundreds of devices to be cooled, because a single heatsink comprising a length of the heatsink material of the present invention can be used to cool groups of integrated circuits, which allows a saving of weight, material cost and labor cost, without impeding air flow to the extent of prior art heatsinks. Furthermore, because the heatsink of the present invention is lightweight, a more reliable attachment to the components to be cooled can be achieved with adhesive, as compared to prior art extruded or machined heatsinks. The heatsink of the present invention can be produced in rolls which can be cut to a required length at the time of application.

It will be appreciated by those skilled in the art that the foregoing detailed description of the present invention has been put forward by way of example only, and that many modifications can be made to the described construction while remaining within the spirit and scope of the present invention as defined in the claims appended hereto.

What is claimed is:

1. A heatsink, comprising:
   a metal foil having a series of base portions interposed with transverse fins, wherein said metal foil is folded so as to form said transverse fins and said base portions; and
   a base sheet coupled to said series of base portions of the folded metal foil.

2. A heatsink, comprising:
   a metal foil having a series of base portions interposed with transverse fins, wherein said metal foil is folded so as to form said transverse fins and said base portions; and wherein each of said fins comprised first and second fin portions of said metal foil joined along a first crease and having adjacent inner surfaces facing one another, and wherein said first and second fin portions are transversely joined along respective second and third creases to respective first and second said base portions.

3. A heatsink as claimed in claim 2, wherein said first and second base portions are at least substantially coplanar.

4. A heatsink as claimed in claim 2, wherein said first and second fin portions are substantially rectangular, and wherein said first crease is along edges of said first and second fin portions which are opposed to said second and third creases, respectively.

5. A heatsink as claimed in claim wherein said first and second fin portions are substantially rectangular, and wherein said first crease is along edges of said first and second fin portions which are adjacent to said second and third creases, respectively.

6. A heatsink as claimed in claim 1, wherein said base sheet comprises a metal foil having first and second surfaces and having said first surface attached to said base portions of said folded metal foil by way of an adhesive.

7. A heatsink as claimed in claim 6, further including an adhesive applied to said second surface of said base sheet for attaching said heatsink to a component surface.

8. A heatsink as claimed in claim further comprising a removable protective sheet applied to the adhesive on said base sheet second surface for protecting said adhesive prior to attaching the heatsink to said component surface.

9. A heatsink as claimed in claim 8, further comprising a removable packing material having portions extending between adjacent fins to prevent bending of the fins prior to attaching the heatsink to said component surface.

10. A heatsink as claimed in claim 9, wherein said packing material comprises a strip of a foamed plastics material having slits for receiving said fins.

11. A heatsink, comprising:
    a metal foil having a series of base portions interposed with transverse fins, wherein said metal foil is folded so as to form said transverse fins and said base portions; and
    a base sheet coupled to said series of base portions of the folded metal foil, wherein said metal foil comprises an elongate strip that is folded to form said heatsink.

12. A heatsink as claimed in claim 11, wherein said heatsink is cut to a predetermined elongate length prior to attaching the heatsink to a component surface.

13. A heatsink, comprising:
    a metal foil having a series of base portions interposed with transverse fins, wherein said metal foil is folded so as to form said transverse fins and said base portions; and
    a base sheet coupled to said series of base portions of the folded metal foil, wherein said base portions are flexible to allow the base portions of the heatsink to simultaneously contact a plurality of component surfaces of different heights.

14. A heatsink as claimed in claim 13, wherein said metal foil is copper.

15. A heatsink as claimed in claim 13, wherein said metal foil is less than 0.5 millimeters thick.

16. A heatsink as claimed in claim 15, wherein the thickness of said metal foil is in the range of about 0.025 millimeters to 0.25 millimeters.

17. A heatsink as claimed in claim 13, wherein said transverse fins extend transversely from said base surfaces by between about 5 millimeters and about 20 millimeters.

18. A heatsink as claimed in claim 17, wherein said fins extend transversely by about 10 millimeters.

19. A heatsink comprising:
   a metal sheet material bent to form a series of base portions interposed with folded transverse fins; and
   a base sheet coupled to said series of base portions of the metal sheet material.

20. A heatsink as claimed in claim 19, wherein said heatsink is flexible to allow said base portions of the heatsink to be attached to a plurality of surfaces, which are not coplanar.

21. A heatsink comprising:
   a metal foil having a series of base portions interposed with transverse fins, wherein said metal foil is folded so as to form said transverse fins and said base portions, and wherein said transverse fins have first and second fin portions extending transversely from said base portions and having adjacent inner surfaces which substantially abut each other along said transverse direction.

* * * * *